(12) United States Patent  
Kim et al.

(10) Patent No.: US 9,023,735 B2  
(45) Date of Patent: May 5, 2015

(54) ETCHANT COMPOSITION AND MANUFACTURING METHOD FOR THIN FILM TRANSISTOR USING THE SAME

(71) Applicant: Samsung Display Co., Ltd., Yongin, Gyeonggi-do (KR)

(72) Inventors: Bong-Kyun Kim, Hwaseong-si (KR); Hong Sick Park, Suwon-si (KR); Wang Woo Lee, Suwon-si (KR); Young Min Moon, Seongnam-si (KR); Seung Ho Yoon, Hwaseong-si (KR); Young Joo Choi, Anyang-si (KR); Sang-Woo Kim, Seongnam-si (KR); Ki-Beom Lee, Seoul (KR); Dae-Woo Lee, Seoul (KR); Sam-Young Cho, Anyang-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 76 days.

(21) Appl. No.: 13/728,348

(22) Filed: Dec. 27, 2012

(65) Prior Publication Data

US 2014/0038348 A1 Feb. 6, 2014

(30) Foreign Application Priority Data

Aug. 3, 2012 (KR) ........................ 10-2012-0085334

(51) Int. Cl.  
*H01L 21/461* (2006.01)  
*H01L 21/465* (2006.01)  
*H01L 29/66* (2006.01)  
*H01L 21/3213* (2006.01)  
*H01L 29/786* (2006.01)

(52) U.S. Cl.  
CPC ........ *H01L 21/465* (2013.01); *H01L 29/66969* (2013.01); *H01L 21/32134* (2013.01); *H01L 29/7869* (2013.01)

(58) Field of Classification Search  
None  
See application file for complete search history.

(56) References Cited

U.S. PATENT DOCUMENTS

| | | |
|---|---|---|
| 2004/0229461 A1 | 11/2004 | Darsillo et al. |
| 2006/0249482 A1 | 11/2006 | Wrschka et al. |
| 2008/0224092 A1* | 9/2008 | Choung et al. ............... 252/79.3 |
| 2008/0318368 A1* | 12/2008 | Ryu et al. ...................... 438/151 |
| 2009/0215658 A1 | 8/2009 | Minsek et al. |
| 2009/0224257 A1* | 9/2009 | Chin et al. ...................... 257/72 |
| 2010/0015805 A1 | 1/2010 | Mayer et al. |
| 2010/0163788 A1* | 7/2010 | Visintin et al. ............... 252/79.3 |
| 2010/0291722 A1 | 11/2010 | Kim et al. |
| 2012/0033001 A1* | 2/2012 | Kim et al. ...................... 345/697 |
| 2012/0100645 A1* | 4/2012 | Lee et al. ........................ 438/22 |
| 2012/0286267 A1* | 11/2012 | Suzawa et al. .................. 257/43 |

FOREIGN PATENT DOCUMENTS

| | | |
|---|---|---|
| KR | 1020090014750 | 2/2009 |
| KR | 1020100040004 | 4/2010 |
| KR | 10-0983060 | 9/2010 |
| KR | 1020110123025 | 11/2011 |

* cited by examiner

*Primary Examiner* — Charles Garber  
*Assistant Examiner* — Brigitte Paterson  
(74) *Attorney, Agent, or Firm* — F. Chau & Associates, LLC (57) ABSTRACT

An etchant composition includes ammonium persulfate $(((NH_4)_2)S_2O_8)$, an azole-based compound, a water-soluble amine compound, a sulfonic acid-containing compound, a nitrate-containing compound, a phosphate-containing compound, a chloride-containing compound, and residual water.

20 Claims, 8 Drawing Sheets

ETCHANT COMPOSITION AND MANUFACTURING METHOD FOR THIN FILM TRANSISTOR USING THE SAME

CROSS-REFERENCE TO RELATED APPLICATION

This application claims priority to Korean Patent Application No. 10-2012-0085334 filed on Aug. 3, 2012, the disclosure of which is hereby incorporated by reference herein in its entirety.

(a) TECHNICAL FIELD

The present disclosure relates to an etchant composition and a method for manufacturing a thin film transistor using the same.

(b) DISCUSSION OF THE RELATED ART

Recently, as it may be required that a flat panel display industry implements high resolution, a large area, and a 3D display, there is a need to ensure a higher response speed. Particularly, an increase in moving speed of electrons at a channel portion of a TFT structure may be required. Accordingly, a low resistance material such as, for example, copper has been used to form a wire, and a method for using an oxide semiconductor to increase the moving speed of electrons in a semiconductor layer has been studied.

A TFT using the oxide semiconductor receives wide attention because the TFT is beneficial for ensuring excellent characteristics and mass production due to a simple structure and process. In the case of the TFT-LCD, it is possible to implement a high speed operation panel by using an oxide TFT having rapid mobility as compared to a known a-Si:H TFT.

Therefore, a technology for controlling an excellent taper etch profile for application of an oxide to a channel portion of a TFT and etching of the channel portion may be required, and it may be necessary for a semiconductor layer to be selectively etched to form a channel portion using an oxide thin film transistor.

SUMMARY OF THE INVENTION

Exemplary embodiments of the present invention provide an etchant composition that collectively etches or selectively etches a low resistance wire and a semiconductor layer formed of an oxide semiconductor, and a method for manufacturing a thin film transistor using the same.

An etchant composition according to an exemplary embodiment of the present invention includes ammonium persulfate (($(NH_4)_2S_2O_8$), an azole-based compound, a water-soluble amine compound, a sulfonic acid-containing compound, a nitrate-containing compound, a phosphate-containing compound, a chloride-containing compound, and residual water.

The etchant composition may further include an assistance oxidizer.

A content of the assistance oxidizer may be about 0.1 wt % to about 2 wt %.

The assistance oxidizer may include one selected from a group consisting of phosphoric acid ($H_3PO_4$), nitric acid ($HNO_3$), acetic acid ($CH_3COOH$), perchloric acid ($HClO_4$), and hydrogen peroxide ($H_2O_2$).

The ammonium persulfate content may be about 0.1 wt % to about 20 wt %, the azole-based compound content may be about 0.01 wt % to about 2 wt %, the water-soluble amine compound content may be about 0.1 wt % to about 5 wt %, the sulfonic acid-containing compound content may be about 0.1 wt % to about 10 wt %, and the nitrate-containing compound content may be about 0.1 wt % to about 10 wt %.

The phosphate-containing compound content may be about 0.1 wt % to about 5 wt %.

The chloride-containing compound content may be about 0.001 wt % to about 1 wt %.

The azole-based compound may include one selected from benzotriazole, aminotetrazole, imidazole, and pyrazole.

The water-soluble amine compound may include one selected from a group consisting of glycine, iminodiacetic acid, lysine, threonine, serine, asparaginic acid, parahydroxyphenyl glycine, dihydroxyethyl glycine, alanine, anthranilic acid, tryptophan, sulfamic acid, cyclohexylsulfamic acid, aliphatic amine sulfonic acid, taurine, aliphatic amine sulfinic acid, and aminoethanesulfinic acid.

The sulfonic acid-containing compound may include one selected from methanesulfonic acid ($CH_3SO_3H$), benzenesulfonic acid ($C_6H_5SO_3H$), and para-toluenesulfonic acid ($C_7H_7SO_3H$).

The nitrate-containing compound may include one selected from a group consisting of ammonium nitrate (NH4NO3), calcium nitrate (Ca(NO3)2), zinc nitrate (Zn(NO3)2), sodium nitrate (NaNO3), aluminum nitrate (Al(NO3)3), barium nitrate (Ba(NO3)2), cerium nitrate (Ce(NO3)3), copper nitrate (Cu(NO3)2), iron nitrate (Fe(NO3)3), lithium nitrate (LiNO3), magnesium nitrate (Mg(NO3)2), manganese nitrate (Mn(NO3)2), silver nitrate (Ag3NO3), and potassium nitrate (KNO3).

The phosphate-containing compound may include one selected from a group consisting of sodium dihydrogen phosphate ($NaH_2PO_4$), disodium phosphate ($Na_2HPO_4$), trisodium phosphate ($Na_3PO_4$), ammonium dihydrogen phosphate ($NH_4H_2PO_4$), diammonium phosphate (($NH4$)2HPO4), triammonium phosphate ((NH4)3PO4), potassium dihydrogen phosphate ($KH_2PO_4$), dipotassium phosphate ($K_2HPO_4$), tripotassium phosphate ($K_3PO_4$), calcium dihydrogen phosphate ($Ca(H_2PO_4)_2$), dicalcium phosphate ($Ca_2HPO_4$), and tricalcium phosphate ($Ca_3PO_4$).

The chloride-containing compound may include one selected from a group consisting of hydrochloric acid (HCl), ammonium chloride (NH4Cl), potassium chloride (KCl), iron chloride (FeCl3), sodium chloride (NaCl), ammonium perchlorate (NH4ClO4), potassium perchlorate (K4ClO4), sodium perchlorate (Na4ClO4), and zinc chloride (ZnCl2).

A manufacturing method of a thin film transistor according to an exemplary embodiment of the present invention includes: forming a gate electrode on a substrate, forming a gate insulating layer, a semiconductor material layer, a barrier material layer, and a metal wire material layer on the gate electrode, forming a metal wire pattern portion, a barrier pattern portion, and a semiconductor layer covering the gate electrode and a peripheral area of the gate electrode by patterning the metal wire material layer, the barrier material layer, and the semiconductor material layer, and exposing the semiconductor layer disposed on an overlapping portion with the gate electrode by patterning the metal wire pattern portion and the barrier pattern portion. The forming of the metal wire pattern portion, the bather pattern portion and the semiconductor layer includes one step of etching using a first etchant, and the exposing of the semiconductor layer includes one step of etching using a second etchant. The first etchant and the second etchant have different compositions, and the second etchant includes a chloride-containing compound.

The semiconductor layer may be formed of an oxide semiconductor.

The metal wire material layer may include a first metal layer and a second metal layer disposed on the first metal layer, the first metal layer may include copper, and the second metal layer may include a copper manganese alloy.

The semiconductor layer may include iridium gallium zinc oxide (IGZO).

The barrier material layer may include gallium zinc oxide (GZO).

The first etchant may include ammonium persulfate $(((NH_4)_2)S_2O_8)$, an azole-based compound, a water-soluble amine compound, a sulfonic acid-containing compound, a nitrate-containing compound, a fluorine-containing compound, and residual water.

The second etchant may include ammonium persulfate $(((NH_4)_2)S_2O_8)$, an azole-based compound, a water-soluble amine compound, a sulfonic acid-containing compound, an assistance oxidizer, a nitrate-containing compound, a phosphate-containing compound, the chloride-containing compound, and residual water.

In the second etchant, the ammonium persulfate content may be about 0.1 wt % to about 20 wt %, the azole-based compound content may be about 0.01 wt % to about 2 wt %, the water-soluble amine compound content may be about 0.1 wt % to about 5 wt %, the sulfonic acid-containing compound content may be about 0.1 wt % to about 10 wt %, the assistance oxidizer content may be about 0.1 wt % to about 2 wt %, and the nitrate-containing compound content may be about 0.1 wt % to about 10 wt %.

The phosphate-containing compound content may be about 0.1 wt % to about 5 wt %, and the chloride-containing compound content may be about 0.001 wt % to about 1 wt %.

The exposing of the semiconductor layer disposed on an overlapping portion with the gate electrode may include forming a source electrode and a drain electrode facing each other with respect to the gate electrode.

As described above, the etchant composition according to an exemplary embodiment of the present invention may selectively etch the metal layer and the oxide semiconductor layer forming the semiconductor layer to form a minute pattern.

BRIEF DESCRIPTION OF THE DRAWINGS

Exemplary embodiments of the present invention can be understood in more detail from the following detailed description taken in conjunction with the attached drawings in which.

DETAILED DESCRIPTION OF EXEMPLARY EMBODIMENTS

Hereinafter, exemplary embodiments of the present invention will be described in detail with reference to the accompanying drawings. As those skilled in the art would realize, the described embodiments may be modified in various different ways, all without departing from the spirit or scope of the present invention.

In the drawings, the thickness of layers, films, panels, regions, etc., may be exaggerated for clarity. It will be understood that when a layer is referred to as being "on" another layer or substrate, it can be directly on the other layer or an intervening layer or layers may also be present. Like reference numerals designate like elements throughout the specification.

As used herein, the singular forms, "a", "an", and "the" are intended to include plural forms as well, unless the context clearly indicates otherwise.

An etchant composition according to an exemplary embodiment of the present invention includes, for example, ammonium persulfate $((NH_4)_2)S_2O_8$, an azole-based compound, a water-soluble amine compound, a sulfonic acid-containing compound, an assistance oxidizer, a nitrate-containing compound, a phosphate-containing compound, a chloride-containing compound, and residual water.

Ammonium persulfate is a main component that etches a wire layer as an oxidant, and a stable compound is formed by etching the wire layer by, for example, a reaction represented by the following Formula 1. In the present exemplary embodiment, the wire layer may be made of a low resistance material including, for example, copper.

$S_2O_8^{-2} + 2Cu \rightarrow 2CuSO_4$      Formula 1.

In the case where the content of ammonium persulfate is less than, for example, about 0.1 wt % on the basis of the total weight of the etchant composition, it is very difficult to etch the wire layer with the etchant. In the case where the content of ammonium persulfate is more than, for example, about 20 wt %, as the etchant excessively and rapidly etches the wire layer, it is difficult to control an etch time. Accordingly, in the present exemplary embodiment, it is beneficial that the content of ammonium persulfate is, for example, about 0.1 wt % to about 20 wt % on the basis of the total weight of the etchant composition.

The azole-based compound includes nitrogen atoms, and is a pentanary hetero ring in which at least one non-carbon atom is included in the ring. The azole-based compound may control the etch rate between the layer materials of upper and/or lower portions of the copper layer by suppressing etching of copper on the wire layer. The azole-based compound may decrease a cut dimension (CD) loss skew of the metal wire thereby readily forming the metal wiring.

For example, the azole-based compound, there may be, a benzotriazole, a aminotetrazole, an imidazole, and a pyrazole.

In the case where the content of the azole-based compound is less than about 0.01 wt % on the basis of the total weight of the etchant composition, the etch rate between the copper layer and lower layer may not be controlled, and a straight property of the metal pattern is largely decreased. In the case where the content of the azole-based compound is more than about 2 wt %, the etch capability of the etchant is decreased by the azole-based compound. Accordingly, it is beneficial that the content of the azole-based compound is about 0.01 wt % to about 2 wt % on the basis of the total weight of the etchant composition.

If the azole-based compound is not included in the etchant composition according to an exemplary embodiment of the present invention, the etching speed for copper may not be controlled, the CD skew is largely increased, and the straight property of the wiring is deteriorated, thereby generating significant difficulties when applying the wiring.

In the present exemplary embodiment, water-soluble amine means a compound that is dissolved in water among compounds when a hydrogen atom of ammonia ($NH_3$) is substituted with a hydrocarbon residual group, and acts as an acidity control agent in the etchant. The water-soluble amine as an etching controlling agent in the etchant composition according to the present exemplary embodiment may contribute to form an excellent taper etching profile.

For example, the water-soluble amine may have an amine shape including sulphonic acid group, a carboxylic acid group, and a sulfin acid group may be any one selected from the group consisting of glycine, an iminodiacetic acid, lysine, threonine, serine, an asparaginic acid, parahydroxyphenyl glycine, dihydroxyethyl glycine, alanine, an anthranilic acid, tryptophan, a sulfamic acid, a cyclohexylsulfamic acid, an aliphatic amine sulfonic acid, taurine, an aliphatic amine sulfinic acid, and an aminoethanesulfinic acid. These may be used alone or in combination of two or more kinds.

In the case where the content of water-soluble amine is less than about 0.1 wt % on the basis of the total weight of the etchant composition, it may not function as the etching controlling agent, while in the case where the content is more than about 5 wt %, the etching speed is deteriorated such that a difficulty may be caused when the compound is applied to a mass-production process.

Accordingly, when the content of the water-soluble amine is more than about 0.1 wt % to less than about 5 wt % on the basis of the total weight of the etchant composition, the etching speed according to the present exemplary embodiment may be smoothly controlled. In the case where one compound as the water-soluble amine is used alone, the content of the water-soluble amine may be about 0.1 wt % to about 5 wt %.

Unlike this, in the case where at least two compounds as the water-soluble amine are mixed and used, the content of the water-soluble amine may be substantially the same as the sum of contents of the compounds, and the sum of contents of the compounds may be more than about 0.1 wt % to less than about 5 wt %.

For example, in the exemplary embodiment, the water-soluble amine may include about 0.05 wt % to about 1 wt % of a sulfamic acid and about 0.05 wt % to about 4 wt % of an iminodiacetic acid. Accordingly, the range of the sum of contents of the sulfamic acid and iminodiacetic add may be substantially the same as the range of the content of the water-soluble amine.

In the present exemplary embodiment, the sulfonic acid-containing compound as a compound including —$SO_3H$ mainly functions as an acidity maintaining agent for compensating a decrease of acidity through decomposition of ammonium persulfate. Examples of the sulfonic acid used in the present exemplary embodiment include but are not limited to methane sulfonic acid ($CH_3SO_3H$), benzene sulfonic acid ($C_6H_5SO_3H$), and p-toluene sulfonic acid ($C_7H_7SO_3H$).

If the content of the sulfonic acid-containing compound is less than 0.1 wt %, the sulfonic acid may not function as the acidity maintaining agent, while if the content of the sulfonic acid-containing compound is more than 10 wt %, the etching speed is increased such that process control is difficult. Accordingly, it is beneficial that the content of the sulfonic acid-containing compound is more than about 0.1 wt % to less than about 10 wt % of the entire weight of the etchant composition.

In the present exemplary embodiment, the nitrate-containing compound is a compound containing nitrate ions (NO3-), and forms an excellent taper etch profile as an etch control agent in the etchant of the present exemplary embodiment of the present composition. As examples thereof, there is a composition that is selected from the group consisting of, for example, ammonium nitrate (NH4NO3), calcium nitrate (Ca(NO3)2), zinc nitrate (Zn(NO3)2), sodium nitrate (NaNO3), aluminum nitrate (Al(NO3)3), barium nitrate (Ba(NO3)2), cerium nitrate (Ce(NO3)3), copper nitrate (Cu(NO3)2), iron nitrate (Fe(NO3)3), lithium nitrate (LiNO3), magnesium nitrate (Mg(NO3)2), manganese nitrate (Mn(NO3)2), silver nitrate (Ag3NO3), and potassium nitrate (KNO3).

If the content of the nitrate-containing compound is less than about 0.1 wt %, the compound cannot act as the etch control agent, and in the case where the content is more than about 10 wt %, the etch rate is deteriorated such that a difficulty may be caused when the compound is applied to a mass-production process. Accordingly, it is beneficial that the content of the nitrate-containing compound is more than about 0.1 wt % to less than about 10 wt % of the entire weight of the etchant composition.

In the present exemplary embodiment, the phosphate-containing compound is a compound including $PO_4^{3-}$, and forms an excellent taper etch profile as the etching control agent in the etchant of the present composition. As examples thereof, there is a composition that is selected from, for example, the group consisting of sodium dihydrogen phosphate (NaH$_2$PO4), disodium phosphate (Na$_2$HPO$_4$), trisodium phosphate (Na$_3$PO$_4$), ammonium dihydrogen phosphate (NH$_4$H$_2$PO$_4$), diammonium phosphate ((NH$_4$)$_2$HPO$_4$), triammonium phosphate ((NH$_4$)$_3$PO$_4$), potassium dihydrogen phosphate (KH$_2$PO$_4$), dipotassium phosphate (K$_2$HPO$_4$), tripotassium phosphate (K$_3$PO$_4$), calcium dihydrogen phosphate (Ca(H$_2$PO$_4$)$_2$), dicalcium phosphate (Ca$_2$HPO$_4$), and tricalcium phosphate (Ca$_3$PO$_4$).

In the case where the content of the phosphate-containing compound is less than about 0.1 wt %, it may not function as the etching controlling agent, while in the case where the content is more than about 5 wt %, the etching speed is deteriorated such that a difficulty may be caused when the compound is applied to a mass-production process.

It is beneficial that the content of the phosphate-containing compound is more than about 0.1 wt % to less than about 5 wt % on the basis of the total weight of the etchant composition.

In the present exemplary embodiment, the chloride-containing compound means a compound including chlorine (Cl) that prevents corrosion of the metal layer to guide uniform corrosion of the metal layer. As examples thereof, there is a composition that is selected from, for example, the group consisting of hydrochloric acid (HCl), ammonium chloride (NH4Cl), potassium chloride (KCl), iron chloride (FeCl3), sodium chloride (NaCl), ammonium perchlorate (NH4ClO4), potassium perchlorate (K4ClO4), sodium perchlorate (Na4ClO4), and zinc chloride (ZnCl2).

In the case where the content of the chloride-containing compound is less than about 0.001 wt % on the basis of the total weight of the etchant composition, a short-circuited metal pattern may not be prevented, while in the case where the content is more than about 1 wt %, the controlling of the etching speed is difficult such that a difficulty may be caused when the compound is applied to a mass-production process. Accordingly, it is beneficial that the content of chloride-containing compound on the basis of the entire weight of the etchant composition is more than about 0.001 wt % to less than about 1 wt %.

In the present exemplary embodiment, the assistance oxidizer as an inorganic acid may be selected from, for example, the group consisting of phosphoric acid ($H_3PO_4$), nitric acid ($HNO_3$), acetic acid ($CH_3COOH$), perchloric acid ($HClO_4$), and hydrogen peroxide ($H_2O_2$). If the content of the assistance oxidizer is less than about 0.1 wt %, the assistance oxidizer may not function as the assistance oxidizer, while if the content of the assistance oxidizer is more than about 5 wt %, the etching speed is increased such that the process control is difficult. Accordingly, it is beneficial that the content of the assistance oxidizer is more than about 0.1 wt % to less than about 5 wt % of the entire weight of the etchant composition.

In the present exemplary embodiment, even though water is not apparently described, the content of water corresponds to a residual content obtained by subtracting the weight percent of the other components other than water from 100% of the entire etchant. As water used in the etchant according to the exemplary embodiment, it is beneficial to use, for example, water of a semiconductor level or ultrapure water.

In the range of the etchant or etchant composition as described in the present exemplary embodiment, the etchant is included in the range of the weight ratio as described above, and even if the composition is out of the weight ratio range or there are substitutions of some components described above as an example, if the fact that the modified constitution is substantially the same as the etchant composition is apparent to those who are skilled in the art, this constitution is included therein.

Experimental Example

The etchant composition according to an exemplary embodiment of the present invention may be used for secondary etching in a process of forming a semiconductor layer including a channel by selectively secondly etching three layers of GZO/Cu/CuMn after firstly etching four layers of IGZO/GZO/Cu/CuMn in a structure in which a semiconductor layer and a source/drain electrode are deposited. When etching the source/drain electrode two times, the width of the wiring may be decreased. Accordingly, the etchant used in the secondary etching process should have a small CD skew.

With respect to the etchant composition according to the present exemplary embodiment, etch characteristics were compared to each other by manufacturing the etchants of Example 1 to Example 4 and Comparative Example 1 to Comparative Example 5 as described in the following Table 1. The compositions of Example 1 to Example 4 and Comparative Example 1 to Comparative Example 5 are described in the following Table 1, and all numerical values are weight ratios (wt %).

TABLE 1

| | APS | Azole-based compound | Water-soluble amine compound | Sulfonic acid-containing compound | Assistance oxidizer | Nitrate-containing compound | Phosphate-containing compound | Chloride-containing compound |
|---|---|---|---|---|---|---|---|---|
| Example 1 | 10 | 1 | 2 | 4 | 1 | 4 | 2 | 0.3 |
| Example 2 | 15 | 1.5 | 2 | 4 | 1 | 4 | 2 | 0.3 |
| Example 3 | 10 | 1 | 2 | 8 | 1 | 8 | 2 | 0.8 |
| Example 4 | 10 | 1 | 2 | 4 | 2 | 4 | 5 | 0.3 |
| Comparative Example 1 | 10 | 1 | 2 | — | 1 | 4 | 2 | 0.3 |
| Comparative Example 2 | 10 | 1 | 2 | 4 | — | 4 | 2 | 0.3 |
| Comparative Example 3 | 10 | 1 | 2 | 4 | 1 | — | 2 | 0.3 |
| Comparative Example 4 | 10 | 1 | 2 | 4 | 1 | 4 | — | 0.3 |
| Comparative Example 5 | 10 | 1 | 2 | 4 | 1 | 4 | 2 | — |

In Table 1, APS is ammonium persulfate, the azole based compound is aminotetrazole, the water-soluble amine compound is iminodiacetic acid, the sulfonic acid-containing compound is benzenesulfonic acid, the assistance oxidizer is nitric acid, and the nitrate-containing compound is ammonium nitrate.

In detail, the etch rate, CD skew, and taper angle of the etchants of the examples and comparative examples were evaluated through an overetching test in which the indium gallium zinc oxide/gallium zinc oxide/copper/copper manganese (IGZO/GZO/Cu/CuMn) four-layered layer having the structure in which the source/drain electrodes and semiconductor layer were laminated was etched more than 100% on the basis of time. In addition, etched lateral cross-sections of the four-layered layer were observed through scanning electron microscopic photographs. The results are described in the following Table 2 and FIG. 1 to FIG. 8.

TABLE 2

| | Copper etch EPD (sec) | S/D CD Skew (um) | S/D taper angle (°) | Performance of etching of the IGZO layer |
|---|---|---|---|---|
| Example 1 | 29 | 0.294 | 50 | X |
| Example 2 | 29 | 0.281 | 49 | X |
| Example 3 | 29 | 0.297 | 50 | X |
| Example 4 | 29 | 0.281 | 48 | X |
| Comparative Example 1 | 33 | 0.324 | 28 | X |
| Comparative Example 2 | 36 | 0.201 | 25 | X |
| Comparative Example 3 | 24 | 0.532 | 30 | X |
| Comparative Example 4 | 20 | 0.684 | 32 | X |
| Comparative Example 5 | 29 | 0.287 | — | X |

The EPD (end point detect) means a state in which the lower layer is exposed to the etchant after the layer material to be etched is completely etched by the etchant. As the EPD value is decreased, the etch capability is increased. The CD skew represents a distance between an end of a photoresist and an end of the metal layer, and the distance should be within an appropriate range so as to not cause a step portion and to ensure uniform taper etching.

In the case of the S/D wire (source electrode/drain electrode), the wire is disposed on an upper end of the layer material and the wire width is important. If an inclination is low, as the inclination length is lengthened as compared to an area of a lower portion of an inclined surface, the wire width of the upper portion of the metal becomes narrow, such that high inclination is preferable.

In Table 2, the etchant according to an exemplary embodiment of the present invention is beneficial in an aspect of obtaining the wiring width when the CD skew of the source/drain electrode is small, however the lower layer is not completely etched and may remain as a residual layer when the CD skew has a very small value. At this time, the taper angle is not uniform such that each CD skew of the S/D wiring should be included in a range of about 0.27 μm to about 0.33 μm. With reference to Table 2, the CD skew of each S/D line formed of the etchant composition according to Examples 1 to 4 of the present invention is in the range of about 0.27 μm to about 0.33 μm.

The etchant composition according to Comparative Examples 1 and 2 has a slow EPD such that the obtaining of the process margin is difficult and the CD skew of the formed S/D wiring represents the low value, however the taper angle of the wiring is very low such that the width of the wiring is narrow, which is not preferable. Also, the etchant composition according to Comparative Examples 3 and 4 has the fast EPD such that excellent etching capacity appears, and accordingly, the CD skew of an extremely large value appears and the taper angle is very low such that the width of the wiring is further narrowly formed.

Particularly, when forming a data line by using the etchant composition according to Comparative Example 5, it may be confirmed that the S/D wiring is partially short-circuited. Accordingly, the short of the S/D wiring may be prevented by the chloride-based compound.

According to the matter examined above, in the case where the S/D line is formed by using the etchant compositions according to Examples 1 to 4 of the present invention, as compared to the case where the etchant compositions according to Comparative Examples 1 to 5 are used, it can be seen that a relatively excellent etch rate can be ensured and the taper angle may have an angle of about 50°.

This profile range provides high inclination allowing maintenance of the wire width of the S/D. In addition, as the CD skew is small, it can be seen that the straight property is excellent and stability is good for the secondary etching of the semiconductor layer pattern including the S/D line.

In addition, Example 1 that is the etchant composition according to an exemplary embodiment of the present invention was manufactured, and storage stability and etch performance with respect to the number of processes were examined. The storage stability was evaluated by performing examination at a low temperature of about 10° C. for about 5 days, and the accumulative inclination was evaluated by performing contamination using copper (Cu) ions in an amount of about 125 ppm per each for about 16 hours. The following Table 3 represents the evaluation results of the storage stability, and the following Table 4 represents the etch results with respect to the accumulative inclination.

TABLE 3

| Etch characteristic | 0 days | 1 day | 3 days | 5 days |
|---|---|---|---|---|
| EPD | 29 sec | 29 sec | 29 sec | 29 sec |
| 100% O/E CD Skew | 0.294 μm | 0.281 μm | 0.274 μm | 0.291 μm |
| Taper Angle | 49° | 50° | 50° | 48° |

Figure 1:
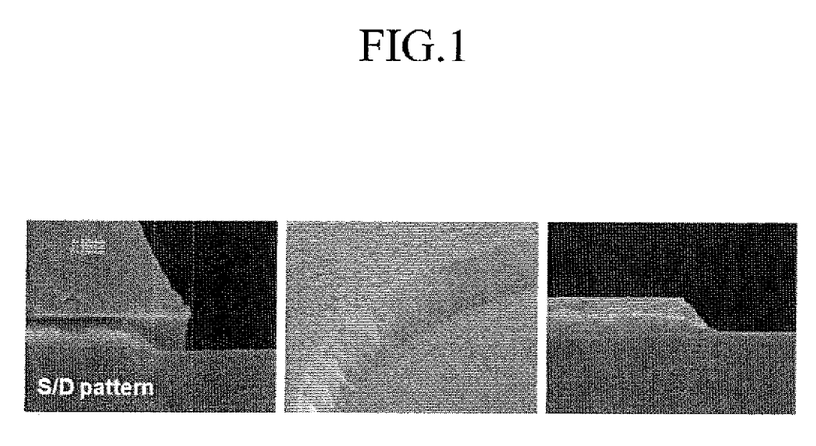
FIG. 1 to FIG. 4 are scanning electron microscopic photographs illustrating when a metal layer and a semiconductor layer are etched by using an etchant composition according to an exemplary embodiment of the present invention.
Figure 2:
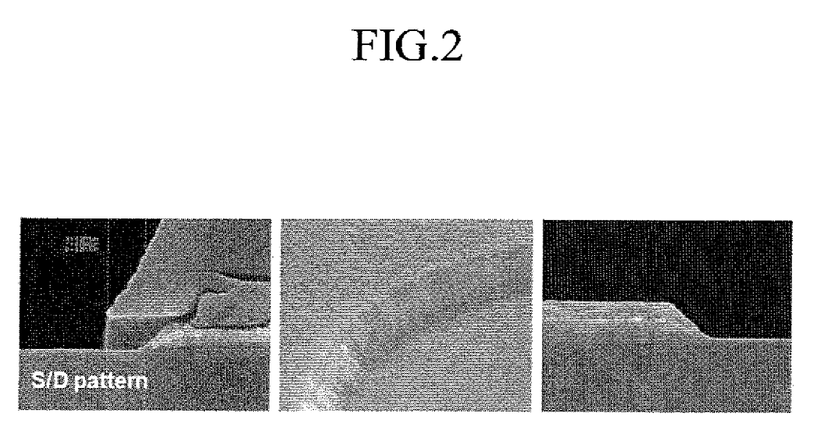
Figure 3:
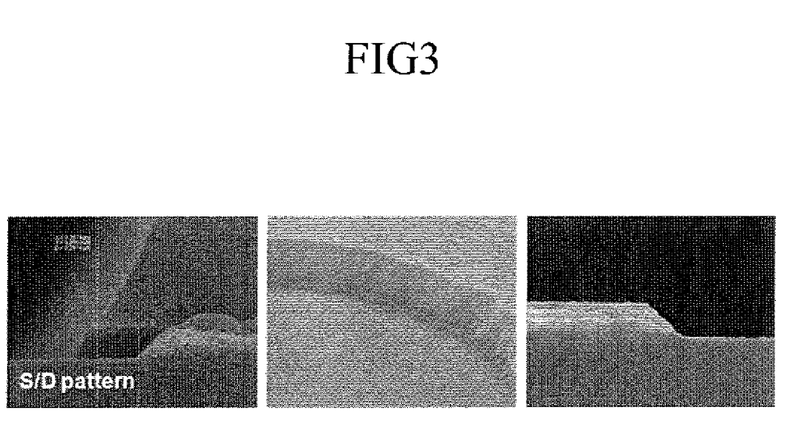
Figure 4:
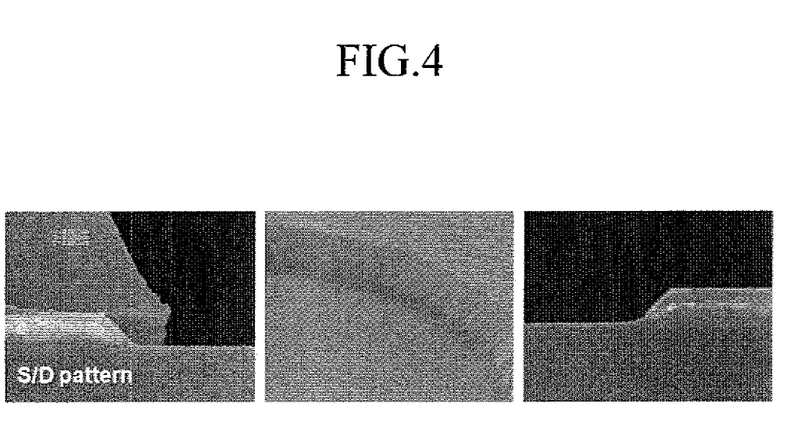
Figure 5:
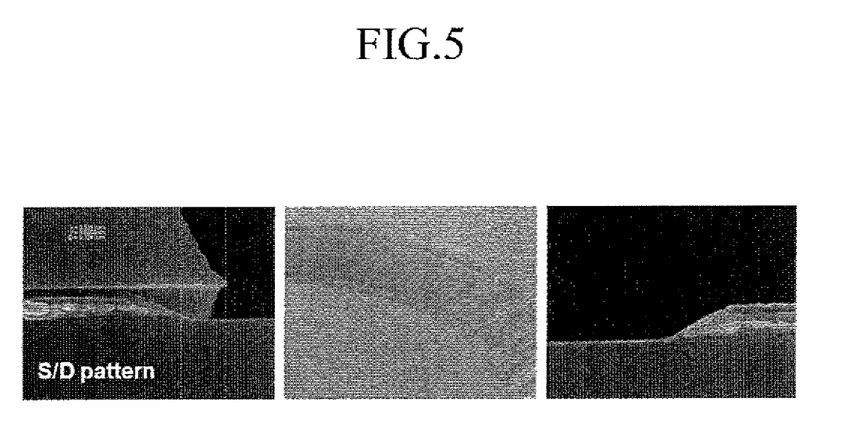
FIG. 5 to FIG. 8 are scanning electron microscopic photographs illustrating when a metal layer and a semiconductor layer are etched by using an etchant composition according to a comparative example.
Figure 6:
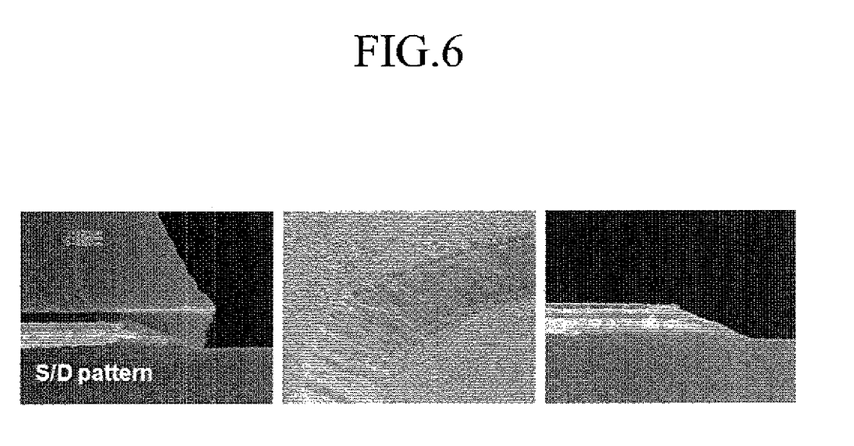
Figure 7:
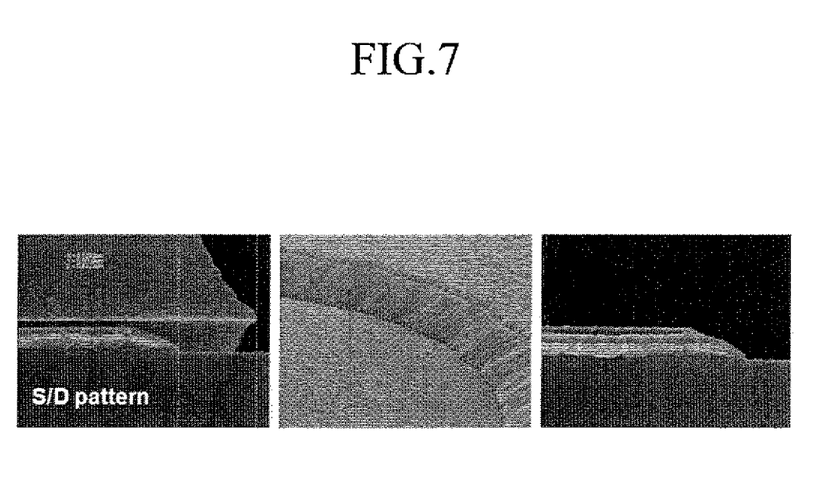
Figure 8:
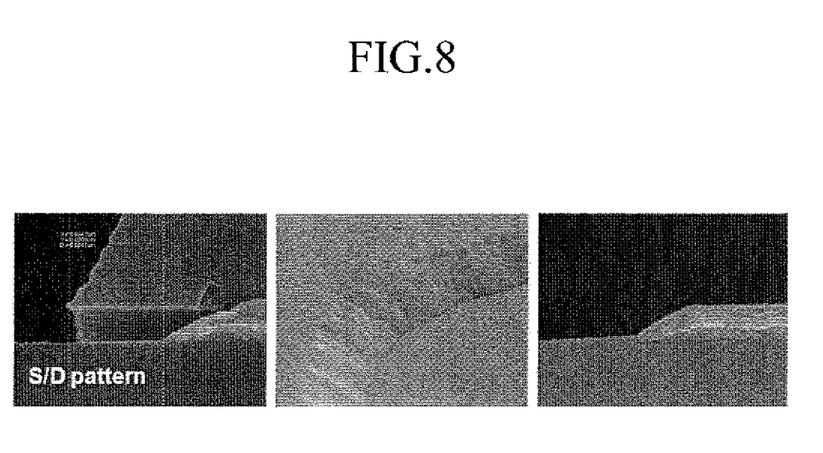
Figure 9:
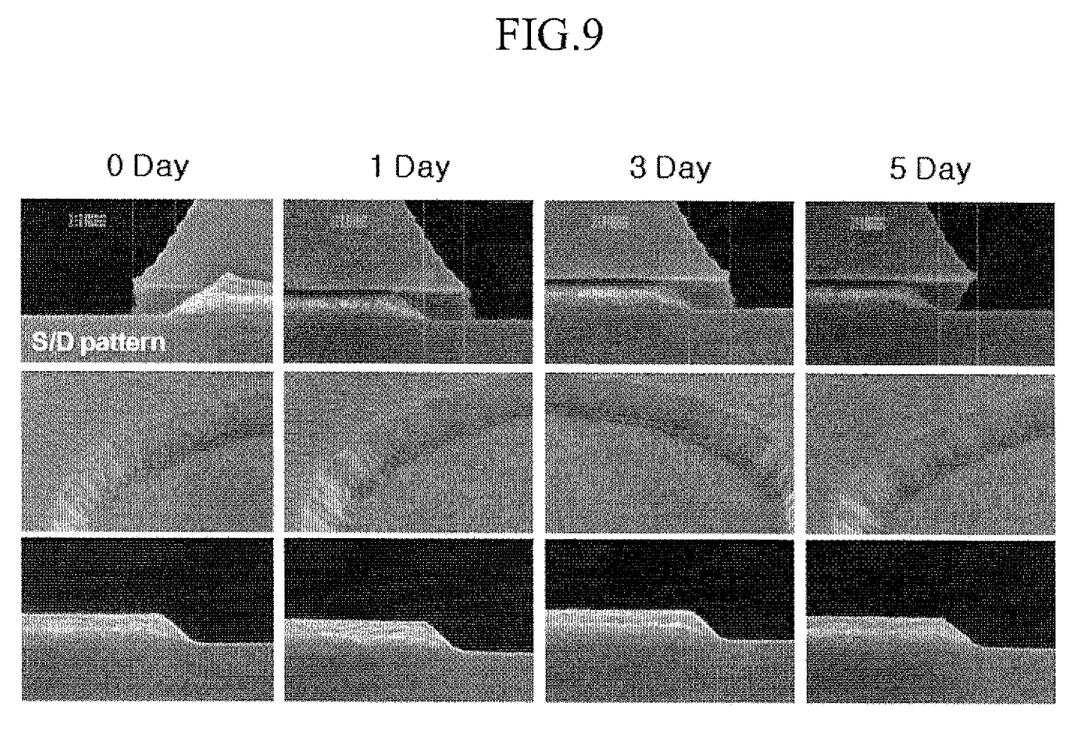
FIG. 9 shows scanning electron microscopic (SEM) photographs illustrating lateral portions of a metal pattern and a photo-pattern manufactured by etching a metal layer according to a duration when the etchant composition according to Example 1 of the present invention is stored at low temperature.

As shown in Table 3 and FIG. 9, the etchant composition of an exemplary embodiment of the present invention has a merit in that, as the etch characteristic is not changed until about 5 days of the initial storage at the low temperature, the initial performance may be maintained.

FIG. 9 shows scanning electron microscopic (SEM) photographs illustrating lateral portions of a metal pattern and a photo-pattern manufactured by etching a metal layer according to duration when the etchant composition according to Example 1 of the present invention is stored at a low temperature.

With reference to Table 3 and FIG. 9, the etch characteristic of the etchant composition according to Example 1 of the present invention is hardly changed until at least about 5 days. Although not shown in Table 3, while the time of the etching end point (EPD) is slowed by about 1 second for about 1 day after about 6 days, the etching performance of the etchant composition may be deteriorated. However, there is a merit in that until about 5 days of storage at the low temperature, the initial performance may be maintained without a change in the etch characteristic.

TABLE 4

| Etch characteristic | 0 ppm/ 0 hr | 500 ppm/ 4 hr | 1000 ppm/ 8 hr | 1500 ppm/ 8 hr | 2000 ppm/ 16 hr |
|---|---|---|---|---|---|
| EPD | 29 sec | 29 sec | 29 sec | 29 sec | 29 sec |
| 100% O/E CD skew | 0.290 μm | 0.287 μm | 0.287 μm | 0.284 μm | 0.300 μm |
| Taper angle | 50° | 49° | 50° | 50° | 50° |

Figure 10:
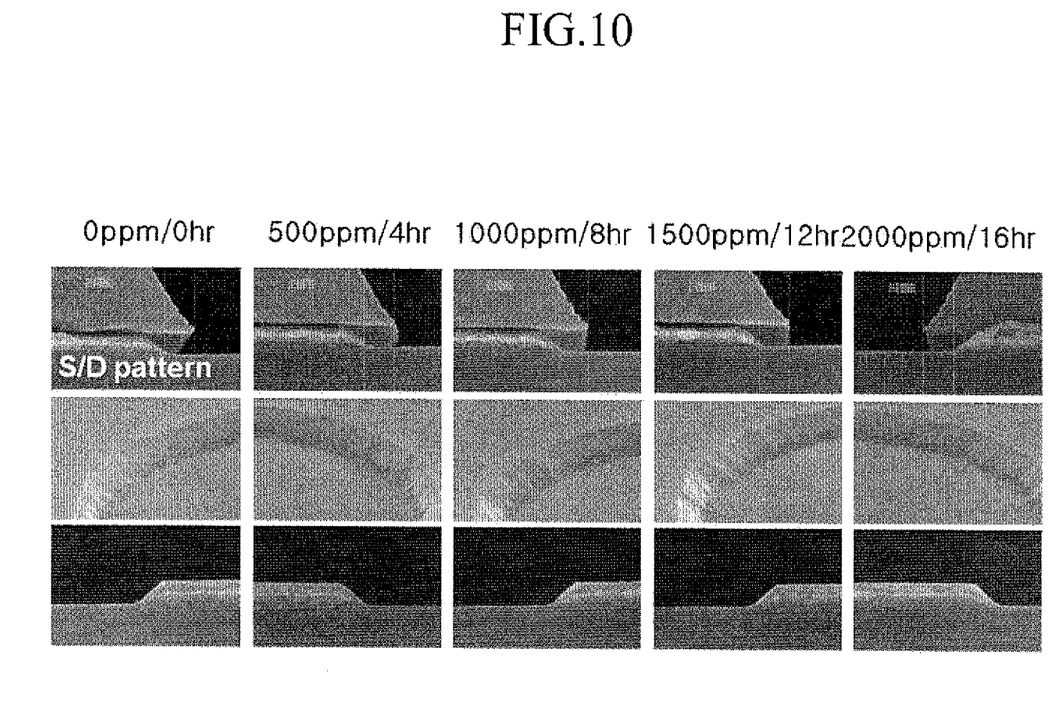
FIG. 10 shows scanning electron microscopic photographs illustrating lateral portions of a metal pattern and a photo-pattern manufactured by etching a metal layer when the etchant composition according to Example 1 of the present invention is contaminated by copper (Cu) ions.

Table 4 and FIG. 10 show scanning electron microscopic photographs illustrating lateral portions of a metal pattern and a photo-pattern manufactured by etching a metal layer according to duration when the etchant composition according to Example 1 of the present invention is contaminated by copper (Cu) ions.

With reference to Table 4 and FIG. 10, it can be seen that the etch characteristic of the etchant composition according to Example 1 of the present invention is hardly changed until the concentration of the copper ions becomes about 2000 ppm. That is, there is a merit in that, even though the indium gallium zinc oxide/gallium zinc oxide/copper/copper manganese (IGZO/GZO/Cu/CuMn) multilayer including the semiconductor layer and S/D wire is etched several times, the initial etch performance may be maintained.

Hereinafter, a method for manufacturing a thin film transistor using the etchant composition as described above will be described.

FIG. 11 to FIG. 14 are cross-sectional views that illustrate a method for manufacturing a thin film transistor according to an exemplary embodiment of the present invention. The present exemplary embodiment is a method of manufacturing a thin film transistor by using the etchant composition according to an exemplary embodiment of the present invention described above.

Figure 11:
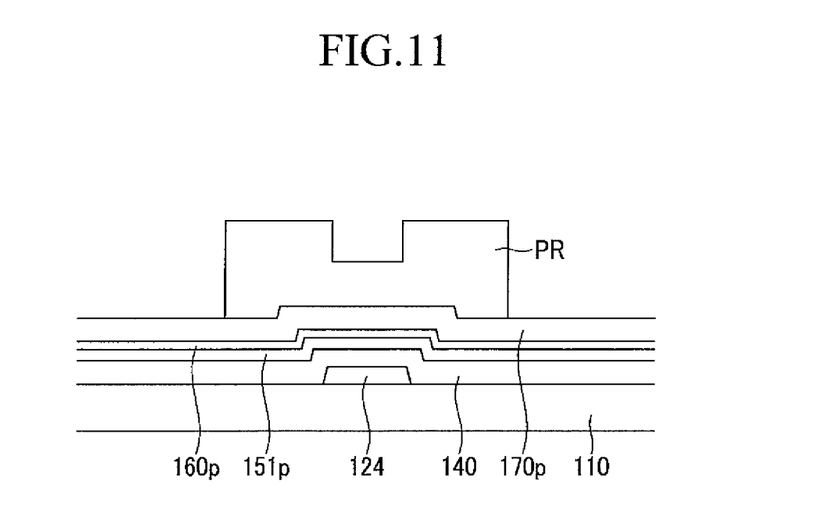
FIG. 11 to FIG. 14 are cross-sectional views that illustrate a method for manufacturing a thin film transistor according to an exemplary embodiment of the present invention.

With reference to FIG. 11, a gate electrode 124 is formed on an insulation substrate 110, and a gate insulating layer 140 covering the gate electrode 124 is formed. The gate electrode 124 may be, for example, a single-layered structure formed of a material including chromium (Cr), tungsten (W), titanium (Ti), tantalum (Ta), molybdenum (Mo), aluminum (Al), copper (Cu), and an alloy thereof. Alternatively, for example, the gate electrode 124 may be a multi-layered structure formed of a combination of materials including Cr, W, Ti, Ta, Mo, Al, Cu and an alloy thereof.

The insulation substrate 110, can be made of, for example, transparent glass, quartz or plastic. Further, in an exemplary embodiment, the glass may include, for example, tempered glass. In an exemplary embodiment, the insulation substrate 110 may be formed of, for example, one of polycarbonate (PC), polyester (PET), polypropylene (PP), polyethylene (PE) and polymethyl methacrylate (PMMA).

The gate insulating layer 140 may be made of, for example, silicon oxide (SiOx) or silicon nitride (SiNx).

A semiconductor material layer 151*p*, a barrier material layer 160*p*, and a metal wire material layer 170*p* are formed on the gate insulating layer 140. Herein, the semiconductor material layer 151*p* is formed of, for example, an oxide including at least one of indium, gallium, zinc, and tin, or of hafnium indium zinc oxide (HfIZO). In addition, the barrier material layer 160*p* may be formed of, for example, gallium zinc oxide (GZO) or indium zinc oxide (IZO).

The metal wire material layer 170*p* may be formed of copper, but exemplary embodiments of the present invention are not limited thereto. For example, the metal wire material layer 170*p* may be formed of a double layer that includes a lower layer including copper and an upper layer including a copper manganese alloy.

A photoresist pattern (PR) is formed on the metal wire material layer 170*p*. The photoresist pattern (PR) overlaps the gate electrode 124 and covers the peripheral area of the gate electrode 124. In this case, a thickness of a portion overlapping the gate electrode 124 is, for example, smaller than a thickness of a portion covering the peripheral area of the gate electrode 124. A portion on which the photoresist pattern (PR) is thinly formed corresponds to a position on which a channel portion of the thin film transistor is formed.

Figure 12:
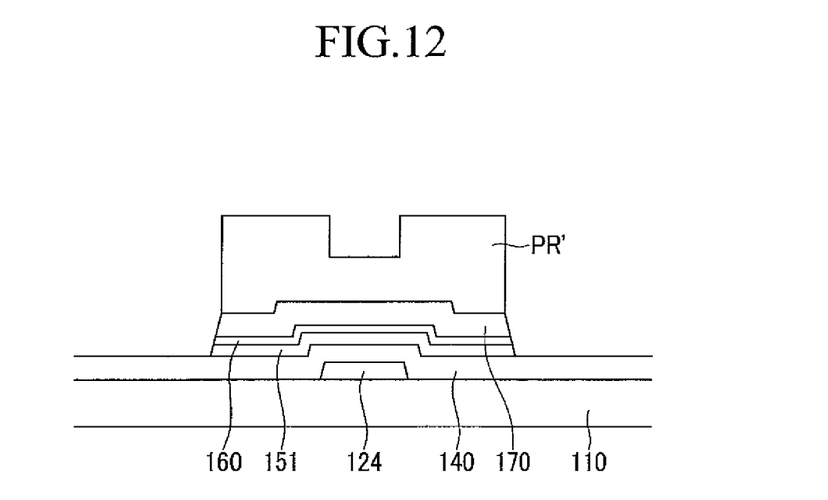

With reference to FIG. 12, the metal wire material layer 170*p*, the barrier material layer 160*p*, and the semiconductor material layer 151*p* are, for example, sequentially etched by using the first etchant. In this case, the gate insulating layer 140 is, for example, exposed by etching the metal wire material layer 170*p*, the barrier material layer 160*p*, and the semiconductor material layer 151*p* disposed at a portion around the gate electrode 124, and the metal wire material layer 170*p* is, for example, exposed by removing the photoresist pattern (PR) disposed at the portion overlapping the gate electrode 124. Herein, the gate electrode 124 and a metal wire pattern portion 170, a barrier pattern portion 160, and a semiconductor layer 151 that cover the peripheral portion of the gate electrode 124 are formed.

The first etchant includes, for example, ammonium persulfate (((NH$_4$)$_2$)S$_2$O$_8$), an azole-based compound, a water-soluble amine compound, a sulfonic acid-containing compound, a nitrate-containing compound, a fluorine-containing compound, and residual water.

If the etching is completed by the first etchant, a photoresist pattern (PR') that is lower than the photoresist pattern (PR) of FIG. 11 is formed.

Figure 13:
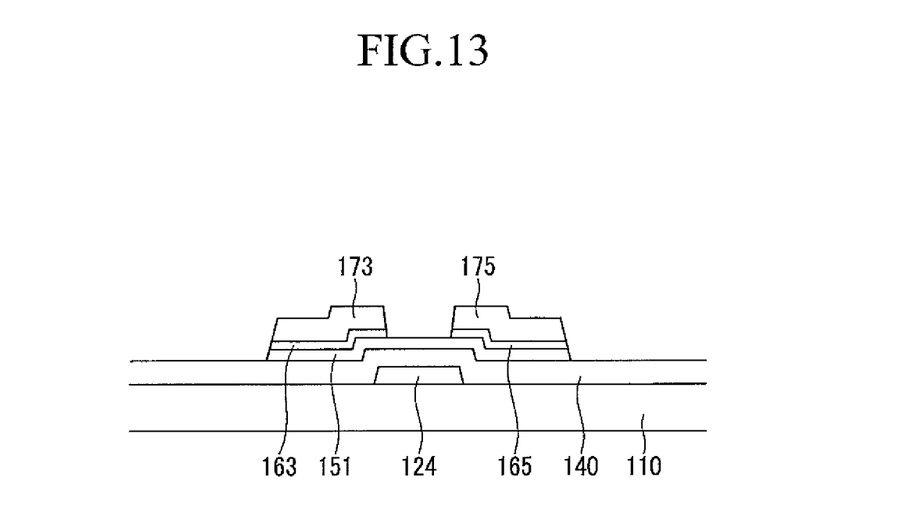

With reference to FIG. 13, the metal wire pattern portion 170 and the barrier pattern portion 160 that are exposed between the photoresist patterns (PR') of FIG. 13 are sequentially etched by using, for example, the second etchant. If the metal wire pattern portion 170 and the barrier pattern portion 160 are sequentially etched, a source electrode 173 and a drain electrode 175 facing each other with respect to the gate electrode 124 are formed, barrier layers 163 and 165 are formed between the source electrode 173 and the semiconductor layer 151, and between the drain electrode 175 and the semiconductor layer 151, respectively.

The barrier layers 163 and 165 may prevent the component such as, for example, copper included in the source/drain electrodes 173 and 175 from being diffused into the channel portion of the thin film transistor.

The second etchant includes, for example, ammonium persulfate (((NH$_4$)$_2$)S$_2$O$_8$), an azole-based compound, a water-soluble amine compound, a sulfonic acid-containing compound, an assistance oxidizer, a nitrate-containing compound, a phosphate-containing compound, a chloride-containing compound, and residual water. The content with respect to the etchant composition according to an example of the present invention may be applied to the second etchant.

In the second etchant, as the fluorine-containing compound is omitted as compared to the first etchant, the metal wire pattern portion 170 that is formed of, for example, the copper single layer or copper/copper manganese multilayer and the barrier pattern portion 160 that is formed of, for example, gallium zinc oxide (GZO) may be etched, and the semiconductor layer 151 that is formed of, for example, indium gallium zinc oxide (IGZO) selectively remains.

In this way, as the second etchant may etch the metal wire pattern portion 170 and the barrier pattern portion 160 together, it is unnecessary to perform a dry etch process for etching the layer corresponding to the barrier layer as in the art. Accordingly, the process time and cost may be decreased, and as the etchant (i.e., the second etchant) according to the examples do not use hydrogen peroxide, difficulties such as a healing phenomenon, deterioration of stability of the etchant, and the addition of an expensive stabilizing agent may be decreased. Also, the etchant composition according to an exemplary embodiment of the present invention ensures the stability of the etchant such that the performance of the etchant may be further maintained for a long time.

Figure 14:
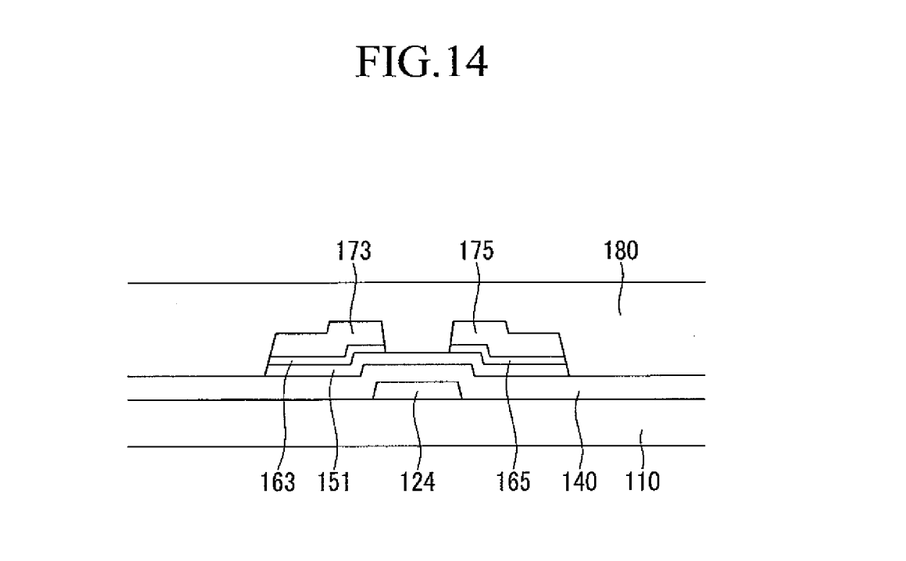

Referring to FIG. 14, a passivation layer 180 is formed by covering the gate insulating layer 140, the source electrode 173, the drain electrode 175, and the exposed semiconductor layer 151. The passivation layer 180 may be formed of, for example, silicon oxide or nitrogen oxide. Alternatively, the passivation layer 180 may be made of, for example, an organic insulator such as, for example, benzocyclobutene (BCB) or acrylic resin.

Having described exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method for manufacturing a thin film transistor, comprising:
   forming a gate electrode on a substrate;
   forming a gate insulating layer, a semiconductor material layer, a barrier material layer, and a metal wire material layer on the gate electrode;
   forming a photoresist pattern on the metal wire material layer;
   performing a first step of etching, using a first etchant, through the metal wire material layer, the barrier material layer, and the semiconductor material layer to form a metal wire pattern portion, a barrier pattern portion, and a semiconductor layer covering the gate electrode and a peripheral area of the gate electrode, respectively;

performing a second step of etching, using a second etchant, through a portion of the metal wire material layer and the barrier material layer that overlaps the gate electrode, wherein the first etchant and the second etchant have different compositions, wherein the second etchant includes a chloride-containing compound, wherein the photoresist pattern covers the metal wire pattern portion overlapping the gate electrode during the first step of etching, and wherein the first etchant is configured to etch the semiconductor material layer while the second etchant is configured not to etch the semiconductor material layer.

2. The method of claim 1, wherein the semiconductor layer is formed of an oxide semiconductor.

3. The method of claim 2, wherein:
the metal wire material layer includes a first metal layer and a second metal layer disposed on the first metal layer, and
wherein the first metal layer includes copper, and the second metal layer includes a copper manganese alloy.

4. The method of claim 1, wherein the semiconductor layer includes indium gallium zinc oxide (IGZO).

5. The method of claim 4, wherein the barrier material layer includes gallium zinc oxide (GZO).

6. The method of claim 1, wherein the first etchant includes ammonium persulfate $(((NH_4)_2)S_2O_8)$, an azole-based compound, a water-soluble amine compound, a sulfonic acid-containing compound, a nitrate-containing compound, a fluorine-containing compound, and residual water.

7. The method of claim 6, wherein the second etchant includes ammonium persulfate $(((NH_4)_2)S_2O_8)$, an azole-based compound, a water-soluble amine compound, a sulfonic acid-containing compound, an assistance oxidizer, a nitrate-containing compound, a phosphate-containing compound, and residual water.

8. The method of claim 7, wherein in the second etchant, the ammonium persulfate content is about 0.1 wt % to about 20 wt %, the azole-based compound content is about 0.01 wt % to about 2 wt %, the water-soluble amine compound content is about 0.1 wt % to about 5 wt %, the sulfonic acid-containing compound content is about 0.1 wt % to about 10 wt %, the assistance oxidizer content is about 0.1 wt % to about 2 wt %, and the nitrate-containing compound content is about 0.1 wt % to about 10 wt %.

9. The method of claim 8, wherein the phosphate-containing compound content is about 0.1 wt % to about 5 wt %, and the chloride-containing compound content is about 0.001 wt % to about 1 wt %.

10. The method of claim 1, wherein the exposing of the semiconductor layer disposed on an overlapping portion with the gate electrode includes forming a source electrode and a drain electrode facing each other with respect to the gate electrode.

11. A method for manufacturing a thin film transistor, comprising:
forming a gate electrode on a substrate;
forming a gate insulating layer, a semiconductor material layer, a barrier material layer, and a metal wire material layer on the gate electrode;
forming a photoresist pattern on the metal wire material layer;
performing a first step of etching, using a first etchant, through the metal wire material layer, the barrier material layer, and the semiconductor material layer to form a metal wire pattern portion, a barrier pattern portion, and a semiconductor layer covering the gate electrode and a peripheral area of the gate electrode, respectively;

performing a second step of etching, using a second etchant, through a portion of the metal wire material layer and the barrier material layer that overlaps the gate electrode, wherein the first etchant and the second etchant have different compositions, wherein the second etchant includes a chloride-containing compound, wherein the photoresist pattern covers the metal wire pattern portion overlapping the gate electrode during the first step of etching, and wherein the first etchant includes a fluorine-containing compound and omits a chloride-containing compound while the second etchant includes the chloride-containing compound and omits a fluorine-containing compound.

12. The method of claim 11, wherein the semiconductor layer is formed of an oxide semiconductor.

13. The method of claim 12, wherein:
the metal wire material layer includes a first metal layer and a second metal layer disposed on the first metal layer, and
wherein the first metal layer includes copper, and the second metal layer includes a copper manganese alloy.

14. The method of claim 11, wherein the semiconductor layer includes indium gallium zinc oxide (IGZO).

15. The method of claim 14, wherein the barrier material layer includes gallium zinc oxide (GZO).

16. The method of claim 11, wherein the first etchant includes ammonium persulfate $(((NH_4)_2)S_2O_8)$, an azole-based compound, a water-soluble amine compound, a sulfonic acid-containing compound, a nitrate-containing compound, a fluorine-containing compound, and residual water.

17. The method of claim 16, wherein the second etchant includes ammonium persulfate $(((NH_4)_2)S_2O_8)$, an azole-based compound, a water-soluble amine compound, a sulfonic acid-containing compound, an assistance oxidizer, a nitrate-containing compound, a phosphate-containing compound, and residual water.

18. The method of claim 17, wherein in the second etchant, the ammonium persulfate content is about 0.1 wt % to about 20 wt %, the azole-based compound content is about 0.01 wt % to about 2 wt %, the water-soluble amine compound content is about 0.1 wt % to about 5 wt %, the sulfonic acid-containing compound content is about 0.1 wt % to about 10 wt %, the assistance oxidizer content is about 0.1 wt % to about 2 wt %, and the nitrate-containing compound content is about 0.1 wt % to about 10 wt %.

19. The method of claim 18, wherein the phosphate-containing compound content is about 0.1 wt % to about 5 wt %, and the chloride-containing compound content is about 0.001 wt % to about 1 wt %.

20. The method of claim 11, wherein the exposing of the semiconductor layer disposed on an overlapping portion with the gate electrode includes forming a source electrode and a drain electrode facing each other with respect to the gate electrode.

* * * * *